United States Patent
Lee et al.

(10) Patent No.: US 7,838,326 B2
(45) Date of Patent: Nov. 23, 2010

(54) METHODS OF FABRICATING SEMICONDUCTOR DEVICE INCLUDING PHASE CHANGE LAYER

(75) Inventors: Jin-Il Lee, Gyeonggi-do (KR); Sung-Lae Cho, Gyeonggi-do (KR); Ik-Soo Kim, Gyeonggi-do (KR); Hye-Young Park, Gyeonggi-do (KR); Do-Hyung Kim, Gyeonggi-do (KR); Dong-Hyun Im, Seoul (KR)

(73) Assignee: Samsung Electronics Co., Ltd. (KR)

( * ) Notice: Subject to any disclaimer, the term of this patent is extended or adjusted under 35 U.S.C. 154(b) by 105 days.

(21) Appl. No.: 12/405,408

(22) Filed: Mar. 17, 2009

(65) Prior Publication Data

US 2009/0233421 A1    Sep. 17, 2009

(30) Foreign Application Priority Data

Mar. 17, 2008    (KR) ..................... 10-2008-0024523

(51) Int. Cl.
    *H01L 21/00* (2006.01)
(52) U.S. Cl. .................. 438/96; 438/760; 257/E31.029
(58) Field of Classification Search .................... 438/96
    See application file for complete search history.

(56) References Cited

U.S. PATENT DOCUMENTS

| | | | |
|---|---|---|---|
| 6,083,597 A * | 7/2000 | Kondo ....................... 428/64.1 |
| 6,635,914 B2 | 10/2003 | Kozicki et al. |
| 6,709,958 B2 | 3/2004 | Li et al. |
| 6,998,312 B2 | 2/2006 | Kozicki et al. |
| 7,101,728 B2 | 9/2006 | Kozicki et al. |
| 7,701,760 B2 * | 4/2010 | Campbell et al. ........... 365/163 |
| 2002/0168820 A1 | 11/2002 | Kozicki et al. |
| 2002/0190350 A1 | 12/2002 | Kozicki et al. |
| 2003/0168651 A1 | 9/2003 | Kozicki |
| 2003/0209971 A1 | 11/2003 | Kozicki |
| 2005/0110983 A1 | 5/2005 | Jeong et al. |
| 2007/0018219 A1 | 1/2007 | Lim et al. |
| 2007/0058417 A1 | 3/2007 | Roehr |
| 2007/0121369 A1 | 5/2007 | Happ |
| 2007/0184613 A1 | 8/2007 | Kim et al. |

FOREIGN PATENT DOCUMENTS

| | | |
|---|---|---|
| JP | 2005-159325 | 6/2005 |
| JP | 2007-214565 | 8/2007 |
| KR | 1020040034680 A | 4/2004 |
| KR | 1020050049810 A | 5/2005 |
| KR | 1020070005040 A | 1/2007 |
| KR | 100745761 B1 | 7/2007 |
| WO | WO 03/020998 A2 | 3/2003 |

* cited by examiner

*Primary Examiner*—Jarrett J Stark
*Assistant Examiner*—Nicholas Tobergte
(74) *Attorney, Agent, or Firm*—Myers Bigel Sibley & Sajovec

(57) ABSTRACT

Provided are methods of fabricating a semiconductor device including a phase change layer. Methods may include forming a dielectric layer on a substrate, forming an opening in the dielectric layer and depositing, on the substrate having the opening, a phase change layer that contains an element that lowers a process temperature of a thermal treatment process to a temperature that is lower than a melting point of the phase change layer. Methods may include migrating a portion of the phase change layer from outside the opening, into the opening by the thermal treatment process that includes the process temperature that is lower than the melting point of the phase change layer.

20 Claims, 8 Drawing Sheets

METHODS OF FABRICATING SEMICONDUCTOR DEVICE INCLUDING PHASE CHANGE LAYER

CROSS-REFERENCE TO RELATED APPLICATIONS

This U.S. non-provisional patent application claims priority under 35 U.S.C. §119 to Korean Patent Application No. 10-2008-0024523, filed on Mar. 17, 2008, the entire contents of which are hereby incorporated herein by reference.

BACKGROUND

The invention described herein relates to methods of fabricating a semiconductor device, and more particularly, to methods of fabricating a semiconductor device including a phase change layer.

Semiconductor devices using phase change materials are increasingly used. For example, a unit cell of a phase change memory device may include a phase change material for storing data. The resistivity of a phase change material may change depending on its phase. That is, the phase change material may have a lower resistivity in a crystalline phase than in an amorphous phase. Such characteristics of the phase change material may be used to store/read data in/from the phase change memory cell.

The phase of a phase-change material may change depending on the temperature of supplied heat and/or the heat supply duration. For example, if heat corresponding to a melting point is supplied to a phase change material for a short time, the phase change material may change into an amorphous phase. On the contrary, if heat of about a crystallization temperature is supplied to a phase change material for a long time, the phase change material may change into a crystalline phase.

In general, heat energy may be used to change the phase of a phase change material. A phase change memory device may utilize a large amount of current to generate high-temperature heat. Consequently, the power consumption of the phase change memory device may increase, which may increase the difficulty of highly integrating the phase change memory device.

SUMMARY

Some embodiments of the present invention provide methods of fabricating a semiconductor device including a phase change layer optimized for high integration. Some embodiments of the present invention provide methods of fabricating a semiconductor device including a phase change layer for minimizing power consumption. Embodiments of methods disclosed herein may include forming a dielectric layer on a substrate, forming an opening in the dielectric layer, and depositing, on the substrate having the opening, a phase change layer that contains an element that lowers a process temperature of a thermal treatment process to a temperature that is lower than a melting point of the phase change layer. Some embodiments include migrating a portion of the phase change layer from outside the opening, into the opening by the thermal treatment process that includes the process temperature that is less than the melting point of the phase change layer.

In some embodiments, the element has a lower melting point than the melting point of the phase change layer. Some embodiments provide that the process temperature of the thermal treatment process is equal to or higher than the melting point of the element. In some embodiments, the element is a metal.

Some embodiments provide that a composition ratio of the element in the phase change layer includes a range from about 1% to about 22%. In some embodiments, a density of the element in a liquid-phase is higher than a density of the specific element in a solid-phase.

Some embodiments include, before depositing the phase change layer, forming a wetting layer conformally on the substrate having the opening. Some embodiments include, before depositing the phase change layer, treating the wetting layer with plasma. In some embodiments, the wetting layer on top of the dielectric layer is treated with the plasma and the wetting layer on a lower sidewall of the opening is untreated with the plasma. In some embodiments, the phase change layer is formed by a chemical vapor deposition (CVD) process, and a deposition rate of the phase change layer on the wetting layer untreated with the plasma is higher than a deposition rate of the phase change layer on the wetting layer treated with the plasma. Some embodiments provide that the wetting layer is treated with hydrogen plasma.

Some embodiments include, before depositing the phase change layer, etching the wetting layer anisotropically to form a wetting spacer on a sidewall of the opening. In some embodiments, the wetting layer includes at least one of niobium oxide and zirconium oxide. Some embodiments provide that the wetting layer has a thickness that is sufficiently thin to allow charges to tunnel therethrough. In some embodiments, the wetting layer includes a conductive material.

Some embodiments provide that depositing the phase change layer and migrating of the portion of the phase change layer from outside the opening, into the opening by the thermal treatment process are performed in situ in a process chamber.

In some embodiments, depositing the phase change layer includes depositing a first phase change layer on the substrate having the opening by a chemical vapor deposition (CVD) process and depositing a second phase change layer on the first phase change layer by a physical vapor deposition (PVD) process. Some embodiments provide that migrating the portion of the phase change layer from outside the opening, into the opening by the thermal treatment process includes migrating a portion of the first phase change layer from outside the opening, into the opening by a first thermal treatment process and migrating a portion of the second phase change layer from outside the opening, into the opening by a second thermal treatment process.

In some embodiments, depositing the first phase change layer and migrating the portion of the first phase change layer from outside the opening, into the opening by the first thermal treatment process are performed in situ in a process chamber. Some embodiments provide that depositing the second phase change layer and migrating the portion of the second phase change layer from outside the opening, into the opening by the second thermal treatment process are performed in situ in a process chamber. In some embodiments, migrating the portion of the phase change layer from outside the opening, into the opening by the thermal treatment process includes migrating a portion of the second phase change layer from outside the opening, into the opening by a first thermal treatment process.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION

Figure 1:
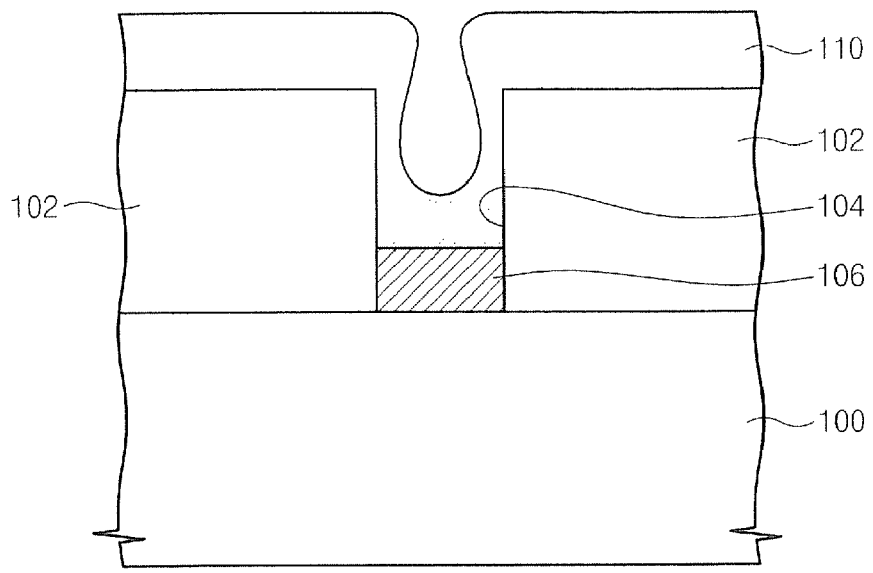
FIGS. 1 through 3 are sectional views illustrating methods of fabricating a semiconductor device according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art.

It should be construed that forgoing general illustrations and following detailed descriptions are exemplified and an additional explanation of claimed inventions is provided.

Reference numerals are indicated in detail in some embodiments of the present invention, and their examples are represented in reference drawings. Throughout the drawings, like reference numerals are used for referring to the same or similar elements in the description and drawings.

Figure 2:
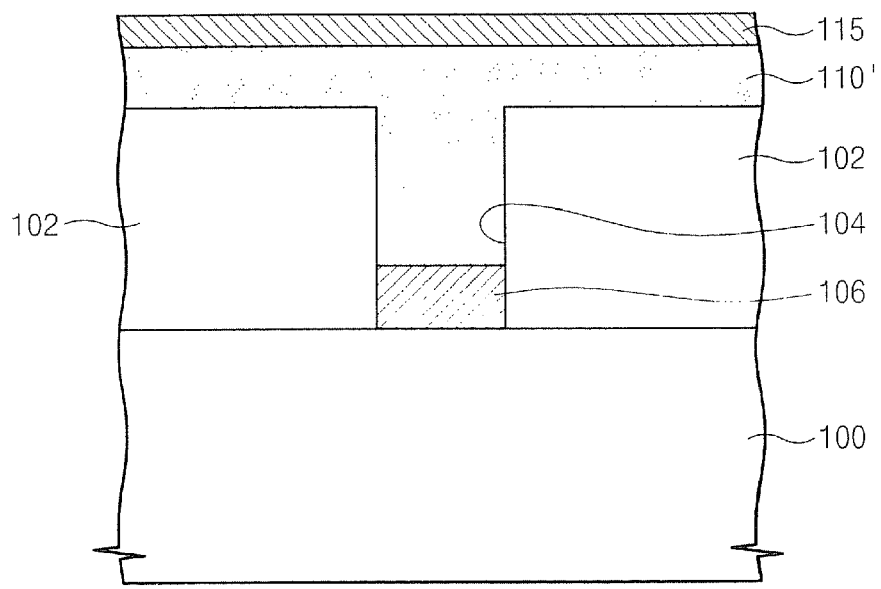
Figure 3:
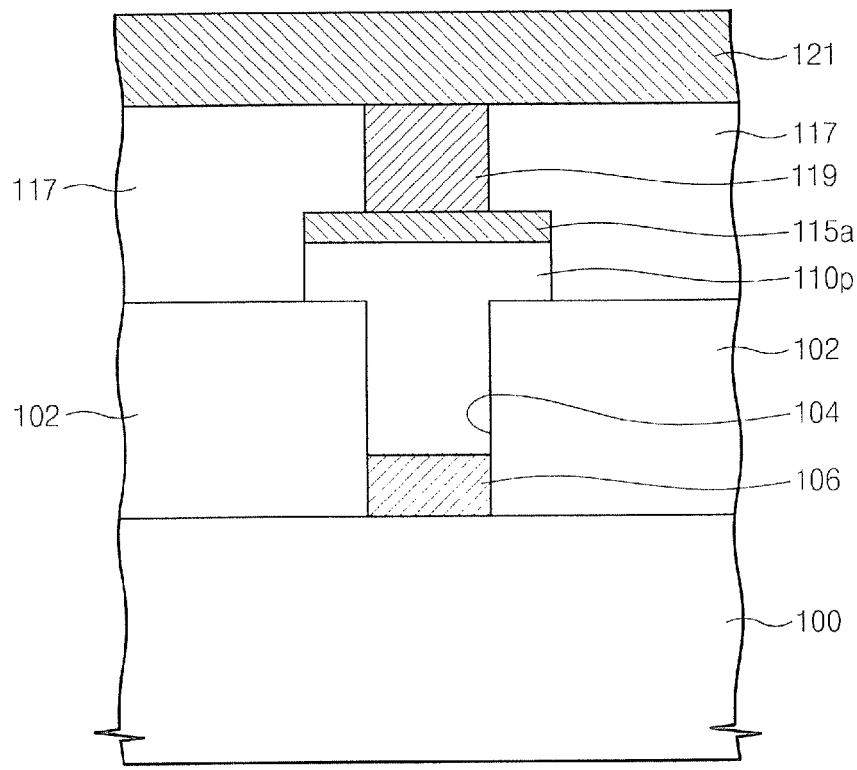

FIGS. 1 through 3 are sectional views illustrating methods of fabricating a semiconductor device according to some embodiments of the present invention. Referring to FIG. 1, a first interlayer dielectric 102 is formed on a substrate 100 and the first interlayer dielectric 102 is patterned to form an opening 104. The substrate 100 may include a switching device such as a diode and/or a transistor. The opening 104 may expose one terminal of the switching device. Some embodiments provide that the first interlayer dielectric 102 may be of a single-layer structure or a multi-layer structure. In some embodiments, the first interlayer dielectric 102 may include at least one of an oxide layer, a nitride layer, and/or an oxynitride layer, among others.

A heater electrode 106 may be formed at the bottom of the opening 104. Specifically, some embodiments provide that a heater electrode layer may be formed over the substrate 100 to fill the opening 104, the heater electrode layer may be planarized to expose the first interlayer dielectric 102, and the planarized heater electrode layer may be recessed to be lower than the top of the first interlayer dielectric 102, thereby forming the heater electrode 106. In some embodiments, the heater electrode 106 may be electrically connected to one terminal of the switching device. The heater electrode 106 may be formed of conductive nitride, among others. For example, the heater electrode 106 may be formed of at least one of titanium nitride, hafnium nitride, vanadium nitride, niobium nitride, tantalum nitride, tungsten nitride, molybdenum nitride, titanium-aluminum nitride, titanium-silicon nitride, titanium-carbon nitride, tantalum-carbon nitride, tantalum-silicon nitride, titanium-boron nitride, zirconium-silicon nitride, tungsten-silicon nitride, tungsten-boron nitride, zirconium-aluminum nitride, molybdenum-silicon nitride, molybdenum-aluminum nitride, tantalum-aluminum nitride, titanium oxynitride, titanium-aluminum oxynitride, tungsten oxynitride, and/or tantalum oxynitride, among others.

In some embodiments, the heater electrode 106 may be formed on the substrate 100 before formation of the interlayer dielectric 102. In this case, the opening 104 may expose the heater electrode 106.

Thereafter, a phase change layer 110 may be deposited over the substrate 100. The phase change layer 110 may be formed of a material that can change into a plurality of phases with different resistivities. For example, some embodiments provide that the phase change layer 110 may be formed of a compound containing at least one chalcogen such as selenium and/or tellurium, among others. In addition, the phase change layer 110 may further contain one or more specific elements. That is, the phase change layer 110 may include a compound containing the specific elements and/or at least one of selenium and/or tellurium.

The phase change layer 110 may be formed using a physical vapor deposition (PVD) process and/or a chemical vapor deposition (CVD) process, among others. Some embodiments provide that an overhang due to the phase change layer 110 may be formed at the top edge of the opening 104. In some embodiments, a void and/or a seam may be generated in the opening 104.

Referring to FIG. 2, a thermal treatment process may be performed on the phase change layer 110. Accordingly, the phase change layer 110 located outside the opening 104 may migrate into the opening 104. Consequently, the thermally-treated phase change layer 110' can fill the opening 104 without allowing a void and/or seam therein. In this manner, a process temperature of the thermal treatment process may become lower than a melting point of the phase change layer 110 due to the specific elements contained in the phase change layer 110. In other words, due to the specific elements, the phase change layer 110 can have a viscosity that allows it to migrate from the outside to the inside of the opening 104 at a temperature lower than the melting point of the phase change layer 110. In some embodiments, the specific element may have a lower melting point than the phase change layer 110. In particular, some embodiments provide that the specific elements may be metals that have a lower melting point than the phase change layer 110. The process temperature of the thermal treatment process may be equal to or higher than the melting point of the specific elements. Thus, the process temperature of the thermal treatment process may be equal to or higher than the melting point of the specific elements and lower than the melting point of the phase change layer 110. In some embodiments, the process temperature of the thermal treatment process may substantially correspond to the temperature of heat supplied to the deposited phase change layer 110. For example, the specific elements may be at least one of bismuth and/or indium, among others. Some embodiments provide that a density of the specific elements in a liquid-phase may be higher than a density of the specific elements in a solid-phase. In such cases, the migration characteristic of the phase change layer 110 due to the thermal treatment process may be further improved. For example, bismuth is one of metals that has a density in a liquid-phase higher than a density in a solid-phase. The migration characteristic of the phase change layer 110 refers to the extent to which the phase change layer 110 outside the opening 104 migrates into the opening 104 due to the thermal treatment process.

Some embodiments provide that the phase change layer 110 may be formed of at least one of a bismuth-germanium-tellurium compound, a bismuth-germanium-tin-tellurium compound, a bismuth-germanium-antimony-tellurium compound, a bismuth-germanium-plumbum-tellurium compound, a bismuth-selenium-antimony compound, an indium-selenium-antimony compound, an indium-antimony-tellurium compound, an indium-argentum-antimony-tellurium compound, and/or an indium-germanium-antimony-tellurium compound, among others, however, the present invention is not so limited. That is, the phase change layer 110 may include other phase change material containing the specific elements and at least one of selenium and/or tellurium.

For example, a bismuth-germanium-tellurium compound has a melting point of about 550° C. and bismuth has a melting point of about 271.5° C. Thus, if the phase change layer 110 is formed of a bismuth-germanium-tellurium compound, the process temperature of the thermal treatment process may be equal to or higher than about 271.5° C. and lower than about 550° C.

The composition ratio of the specific elements in the phase change layer 110 may be about 1% to about 22%. If the composition ratio of the specific elements is smaller than about 1%, the migration characteristic of the phase change layer 110 due to the thermal treatment process may decrease rapidly. If the composition ratio of the specific elements is greater than about 22%, the phase change layer 110 may lose phase change characteristics. The phase change characteristics of the phase change layer 110 refers to a resistivity change corresponding to a phase change. Specifically, if the composition ratio of the specific elements is greater than about 22%, even when a program operation is performed on the phase change layer 110, the phase of the phase change layer 110 may not change (e.g., from amorphous phase to crystalline phase or from crystalline phase to amorphous phase). In particular, if the specific elements are metals and the composition ratio is greater than about 22%, the phase change layer 110 may be metallized and lose phase change characteristics. Thus, according to some embodiments of the present invention, the composition ratio of the specific elements in the phase change layer 110 is controlled to be about 1% to about 22%, thereby making it possible to minimize the characteristic degradation of the phase change layer 110 while securing the sufficient migration characteristic of the phase change layer 110.

Some embodiments provide that the deposition process of the phase change layer 110 and the thermal treatment process of the phase change layer 110 may be performed in situ in the same process chamber. In such cases, the deposition process and the thermal treatment process of the phase change layer 110 may be performed sequentially. In some embodiments, the deposition process and the thermal treatment process of the phase change layer 110 may be performed simultaneously. That is, the phase change layer 110 may be deposited while heating the substrate 100 with the opening 104 at the process temperature of the thermal treatment process. In such cases, a portion of the phase change layer 110 deposited outside the opening 104 may migrate into the opening 104 by receiving heat from the substrate 100 heated by the thermal treatment process. According to some embodiments of the present invention, the deposition process of the phase change layer 110 and the thermal treatment process of the phase change layer 110 may be performed ex situ in different process chambers.

As described above, some embodiments provide that the phase change layer 110 may be deposited using a PVD process. In such cases, the phase change layer 110 may be deposited in a process chamber using a target including a phase change material containing the specific elements. In some embodiments, the phase change layer 110 may be deposited using a CVD process. If the phase change layer 110 is deposited using a CVD process, a process gas may include a first source gas containing at least one of selenium and/or tellurium and a second source gas containing the specific elements. For example, some embodiments provide that the specific element is bismuth, the second source gas may contain at least one of $Bi[CH(CH_3)_2]_3$, $Bi(t-Bu)_3$, $Bi(i-Bu)_3$, $Bi(i-Propene)_3$, $Bi(NMe_2)_3$, and/or $Bi(NSiMe_3Me)Me_2$, among others.

Thereafter, a capping layer 115 may be formed over the substrate 100. The capping layer 115 may be formed on the thermally-treated phase change layer 110'. In some embodiments, the capping layer 115 may be formed on the deposited phase change layer 110 and the thermal treatment process may be performed after formation of the capping layer 115. In such embodiments, the capping layer 115 may not be formed in the opening 104. For example, some embodiments provide that if the capping layer 115 is formed on the deposited phase change layer 110, a closed void may be formed in the opening 104. Accordingly, the capping layer 115 may not be formed in the opening 104. Some embodiments provide that formation of the capping layer 115 on the deposited phase change layer 110 may prevent the surface evaporation of the phase change layer 110 that may occur due to the thermal treatment process.

In some embodiments, the capping layer 115 may be formed of conductive metal nitride having good reaction resistance to the phase change layer 110'. For example, the capping layer 115 may be formed of at least one of titanium nitride, hafnium nitride, vanadium nitride, niobium nitride, tantalum nitride, tungsten nitride, molybdenum nitride, titanium-aluminum nitride, titanium-silicon nitride, titanium-carbon nitride, tantalum-carbon nitride, tantalum-silicon nitride, titanium-boron nitride, zirconium-silicon nitride, tungsten-silicon nitride, tungsten-boron nitride, zirconium-aluminum nitride, molybdenum-silicon nitride, molybdenum-aluminum nitride, tantalum-aluminum nitride, titanium oxynitride, titanium-aluminum oxynitride, tungsten oxynitride, and/or tantalum oxynitride, among others.

Referring to FIG. 3, the capping layer 115 and the phase change layer 110' may be sequentially patterned to form a phase change pattern 110p and a capping electrode 115a that are sequentially stacked. Some embodiments provide that a portion of the phase change pattern 110p may fill the opening 104 on the heater electrode 106 and/or another portion of the phase change pattern 110p may be disposed on the first interlayer dielectric 102. If the heater electrode 106 is formed under the first interlayer dielectric 102, a portion of the phase change pattern 110p may fill the whole of the opening 104.

In some embodiments, a second interlayer dielectric 117 is formed over the substrate 100, and an interconnection plug 119 is formed that penetrates the second interlayer dielectric 117 and connects with the capping electrode 115a. Some embodiments provide that an interconnection 121 contacting with the interconnection plug 119 is formed on the second interlayer dielectric 117. The second interlayer dielectric 117 may be formed of at least one of an oxide layer, a nitride layer, and/or oxynitride layer, among others. The interconnection plug 119 and the interconnection 121 are formed of conductive materials.

Some embodiments provide that the phase change pattern may be formed in other methods. Specifically, some embodiments provide that the capping layer 115 and the phase change layer 110' of FIG. 2 may be planarized to expose the first interlayer dielectric 102. In such embodiments, the phase change pattern 110p may be limited within the opening 104. If the capping layer 115 and the phase change layer 110' are planarized, the capping layer 115 may be formed of the above-described conductive materials and/or dielectric materials (e.g., an oxide layer, a nitride layer, an oxynitride layer, and/or a carbonate layer). In some embodiments, the whole of the phase change pattern 110p may be formed in the opening 104, the interconnection plug 119 may be omitted and the interconnection 121 may be formed on the first interlayer dielectric 102 to connect with the phase change pattern 110p. In such embodiments, the interconnection 121 may be formed of a conductive material with a lower resistivity than the heater electrode 106. Accordingly, a phase change area of the phase change pattern 110p may be limited within an area adjacent to the heater electrode 106.

According to semiconductor device fabrication methods described above, the phase change pattern 110p may be formed in the opening 104. Accordingly, a phase change area (e.g., a program area) of the phase change pattern 110p may be limited within the opening 104. That is, the phase change area of the phase change pattern 110p may be formed to be small. In this regard, it may be possible to reduce the current amount necessary to change the resistivity of the phase change pattern 110p. Consequently, it may be possible to implement a semiconductor device of high integration and/or low power consumption.

Some embodiments provide that the phase change layer 110 includes the specific elements. Accordingly, the process temperature of the thermal treatment process may be lowered below the melting point of the phase change layer 110. That is, a portion of the phase change layer 110 that is located outside the opening 104 may migrate into the opening 104 at the process temperature lower than the melting point of the phase change layer 110, thus filling the opening 104. Consequently, the characteristic degradation of the phase change layer 110' may be prevented and the generation of a void and/or a seam may be prevented.

If the process temperature of the thermal treatment process is equal to or higher than the melting point of the phase change layer 110, some elements in the phase change layer 110' may evaporate and/or the layer characteristics of the phase change layer 110' may change. Accordingly, the phase change characteristics of the phase change layer 110' may degrade. According to some embodiments of the present invention, the phase change layer 110 contains the specific elements, thereby making it possible to lower the process temperature of the thermal treatment process below the melting point of the phase change layer 110. Accordingly, a semiconductor device according to some embodiments of the present invention may prevent the characteristic degradation of the phase change layer 110' and may remove a void and/or a seam in the opening 104.

Figure 4:
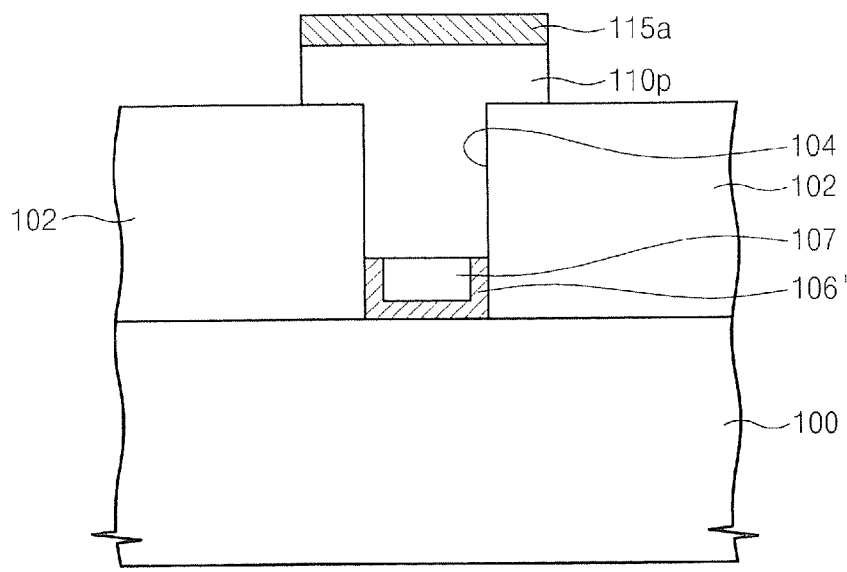
FIG. 4 is a sectional view illustrating another shape of a heater electrode in a semiconductor device according to some embodiments of the present invention.

In some embodiments, the heater electrode 106 is formed to be pillar-shaped. Some embodiments provide that the heater electrode may have other shapes, as illustrated in FIG. 4, which is a sectional view illustrating another shape of a heater electrode in a semiconductor device according to some embodiments of the present invention. Referring to FIG. 4, a heater electrode 106' may be disposed in the bottom of an opening 104. Some embodiments provide that the heater electrode 106' may have the shape of a hollow cylinder. That is, the heater electrode 106' may be disposed conformally along the bottom surface and the lower sidewalls of the opening 104. A sacrificial insulating pattern 107 may be disposed in the bottom of the opening 104. The sacrificial insulating pattern 107 may be surrounded by the heater electrode 106'. A phase change pattern 110p may contact the top of the sacrificial insulating pattern 107 and the top of the heater electrode 106'.

Some embodiments provide that the heater electrode 106' is formed as follows. A heater electrode layer may be formed conformally on a substrate 100 having the opening 104 and a sacrificial insulating layer filling the opening may be formed on the heater electrode layer. The sacrificial insulating layer and the heater electrode layer may be planarized to expose the first interlayer dielectric 102. Thereafter, the planarized sacrificial insulating layer and heater electrode layer may be recessed lower than the top of the first interlayer dielectric 102, thereby forming the sacrificial insulating pattern 107 and the heater electrode 106'. Thereafter, the subsequent processes, including the thermal treatment process and/or the deposition process of the phase change layer described with reference to FIGS. 1 through 3, may be performed.

Figure 5:
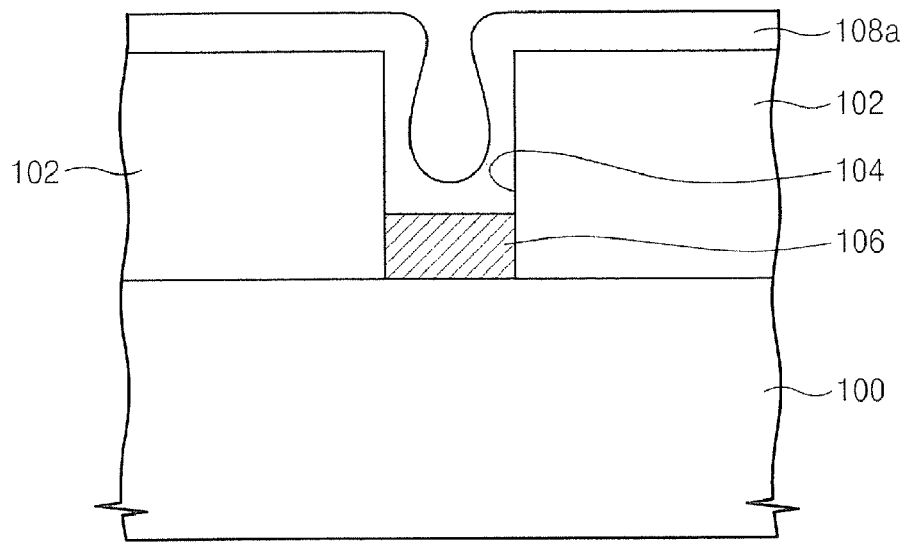
FIGS. 5 through 7 are sectional views illustrating methods of fabricating a semiconductor device according to some embodiments of the present invention.
Figure 6:
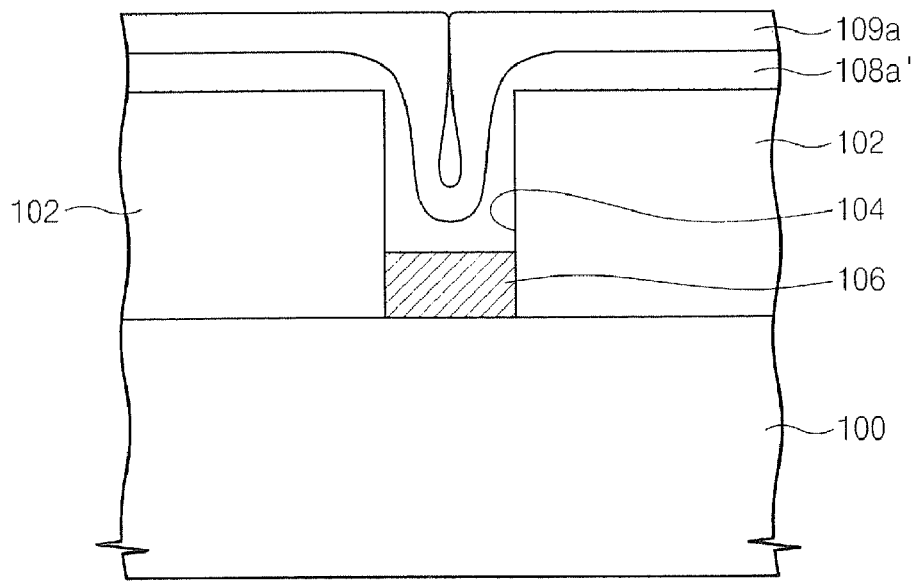
Figure 7:
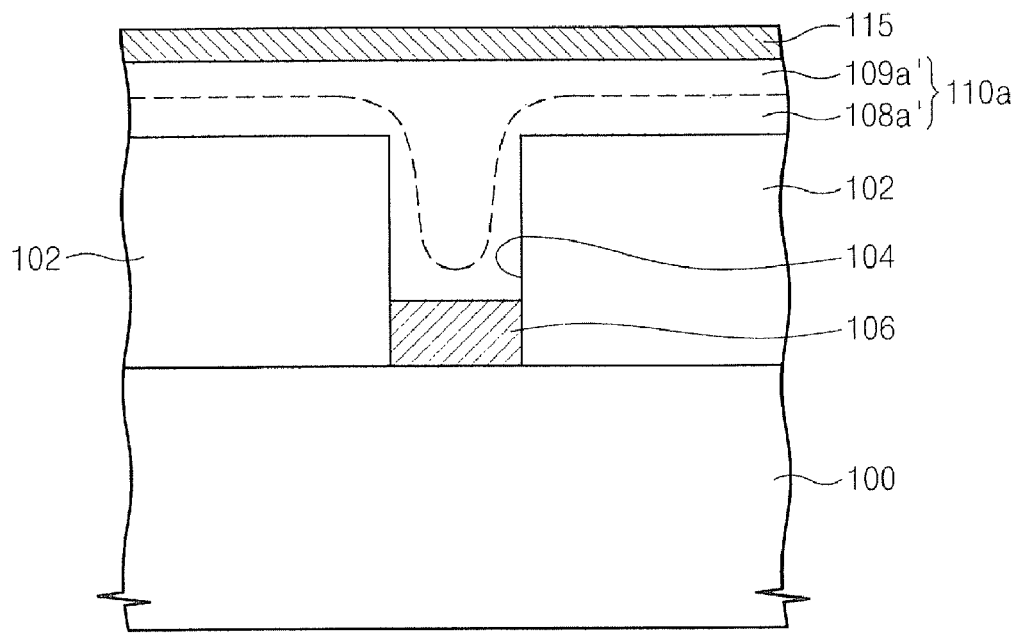

Some embodiments include methods of depositing a phase change layer repeatedly. For example, FIGS. 5 through 7 are sectional views illustrating methods of fabricating a semiconductor device according to some other embodiments of the present invention. Referring to FIG. 5, a CVD process may be performed to form a first phase change layer 108a on a substrate 100 having an opening 104. The first phase change layer 108a may contain at least one of selenium and/or tellurium, and one or more specific elements. Some embodiments provide that a process gas used in the CVD process may include a first source gas containing at least one of selenium and/or tellurium and a second source gas containing the specific elements. In some embodiments, the process gas may further include a third source gas containing other elements. Some embodiments provide that the specific elements may be the same as those above regarding FIGS. 1-3. In some embodiments, the first phase change layer 108a may be formed of the same material as the phase change layer 110 discussed above regarding FIGS. 1-3.

Referring to FIG. 6, a first thermal treatment process may be performed on the first phase change layer 108a. Via the first thermal treatment process, a portion of the first phase change layer 108a, which is located outside the opening 104, may migrate into the opening 104. A first phase change layer 108a' resulting from the first thermal treatment process may fill a portion of the opening 104. In this regard, another portion of the opening 104 may be empty after the first thermal treatment process. The first thermal treatment process may be the same as the thermal treatment process as discussed above regarding FIGS. 1-3. That is, due to the specific elements in the first phase change layer 108a, a process temperature of the first thermal treatment process may be lower than a melting point of the first phase change layer 108a. The process temperature of the first thermal treatment process may be equal to or higher than a melting point of the specific elements contained in the first phase change layer 108a.

Some embodiments provide that the first thermal treatment process and the deposition process of the first phase change layer 108a may be performed in situ in the same process chamber. In some embodiments, the first thermal treatment process and the deposition process of the first phase change layer 108a may be performed ex situ in different process chambers.

Thereafter, a PVD process may be performed to deposit a second phase change layer 109a over the substrate 100. The second phase change layer 109a may contain at least one of selenium and/or tellurium and the specific elements. Some embodiments provide that the second phase change layer 109a may be formed of the same material as the first phase change layer 108a. A void and/or a seam may be generated in the opening 104 after the deposition of the second phase change layer 109a.

Referring to FIG. 7, a second thermal treatment process may be performed on the substrate 100 having the second phase change layer 109a. Accordingly, a portion of the second phase change layer 109a, which is located outside the opening 104, may migrate into the opening 104. In this manner, a second phase change layer 109a' resulting from the second thermal treatment process may fill the opening 104. The second thermal treatment process may be the same as the thermal treatment process as discussed above regarding FIGS. 1-3. Some embodiments provide that, due to the specific elements in the second phase change layer 109a, a process temperature of the second thermal treatment process may be lower than a melting point of the second phase change layer 109a. Also, the process temperature of the second thermal treatment process may be equal to or higher than a melting point of the specific elements contained in the second phase change layer 109a. In some embodiments, the second thermal treatment process and the deposition process of the second phase change layer 109a may be performed in situ and/or ex situ. A phase change layer 110a including the first and second phase change layers 108a and 109a may fill the opening 104 on a heater electrode 106. In some embodiments, the heater electrode 106 may be replaced by the heater electrode 106' of FIG. 4.

According to the above-described methods, an aspect ratio of the space in the opening 104 may be reduced by the first phase change layer 108a' resulting from the first thermal treatment process and then the opening 104 may be completely filled by the second thermal treatment process and the deposition process of the second phase change layer 109a. Accordingly, the phase change layer 110a may fill the opening 104 more easily.

According to some embodiments of the present invention, the first thermal treatment process may be omitted. That is, in some embodiments, the first phase change layer 108a may be deposited by a CVD process, the second phase change layer 109a may be deposited by a PVD process and thereafter a one-time thermal treatment process may be performed thereon. Some embodiments provide that the first phase change layer 108a with a relatively good step coverage may be deposited and the second phase change layer 109a may be deposited, thereby making it possible to reduce the size of a void and/or seam in the opening 104. In this manner, the phase change layer 110a may fill the opening 104 more easily.

According to some embodiments of the present invention, the second thermal treatment process may be omitted. That is, some embodiments provide that the first phase change layer 108a may be deposited by a CVD process, the first thermal treatment process may be performed and thereafter the second phase change layer 109a may be deposited by a PVD process. In such embodiments, the opening 104 may be filled by the first phase change layer 108a' resulting from the first thermal treatment process. A capping layer 115 may be formed over the substrate 100. In some embodiments, the capping layer 115 may be formed on the second phase change layer 109a' resulting from the second thermal treatment process. In some embodiments, the capping layer 115 may be formed on the deposited second phase change layer 109a before the second thermal treatment process.

Some embodiments provide that the capping layer 115 and the phase change layer 110a may be sequentially patterned to form the phase change pattern 110p and the capping electrode 115a of FIG. 3. In some embodiments, the capping layer 115 and the phase change layer 110a may be planarized to expose a first interlayer dielectric 102, thereby forming a phase change pattern within the opening 104.

Figure 8:
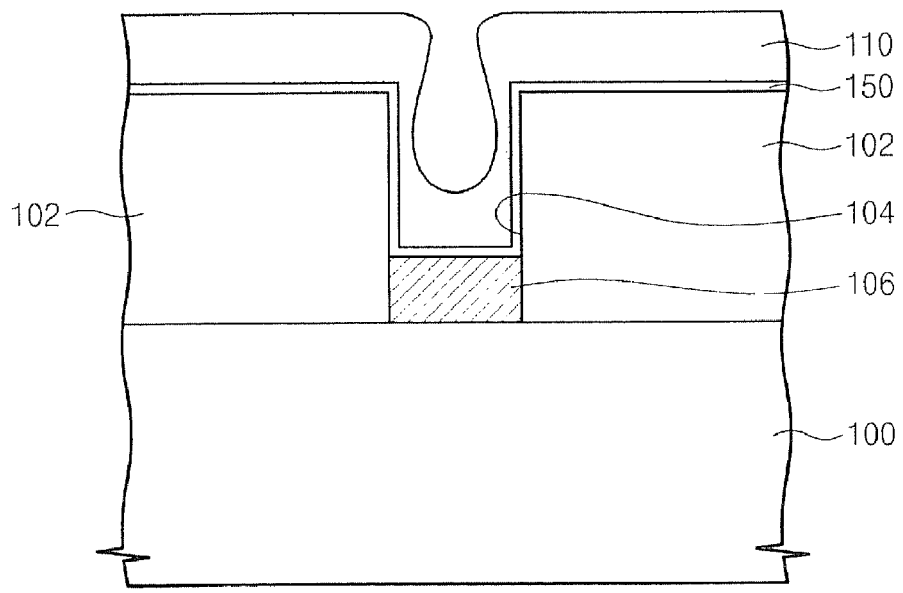
FIGS. 8 through 10 are sectional views illustrating methods of fabricating a semiconductor device according to some embodiments of the present invention.

In some embodiments, methods of fabricating a semiconductor device that can facilitate the migration characteristic of a phase change layer are disclosed herein. For example, reference is now made to FIGS. 8 through 10, which are sectional views illustrating methods of fabricating a semiconductor device according to some further embodiments of the present invention. Referring to FIG. 8, a heater electrode 106 is formed in the bottom of an opening 104. The heater electrode 106 may be replaced by the heater electrode 106' illustrated in FIG. 4. A wetting layer 150 is formed conformally over a substrate 100 having the opening 104. Some embodiments provide that the wetting layer 150 may be formed conformally on the top and the sidewalls of the opening 104. A phase change layer 110 is deposited on the wetting layer 150. The phase change layer 110 may be formed of the same material as that discussed above regarding FIGS. 1-3. That is, the phase change layer 110 may contain at least one of selenium and/or tellurium and one or more specific elements.

In some embodiments, the wetting layer 150 may be formed of a material capable of improving the wettability of the phase change layer 110. The wettability refers to the extent to which the phase change layer 110 spreads on the wetting layer 150. Some embodiments provide that the wetting layer 150 may be formed of a conductive material. For example, the wetting layer 150 may be formed of at least one of titanium, titanium-containing material, tantalum, and/or conductive metal nitride (e.g., titanium nitride, tantalum nitride, and tungsten nitride), among others. In some embodiments, the wetting layer 150 may be formed of a dielectric material. For example, some embodiments provide that the wetting layer 150 may be formed of at least one of niobium oxide and/or zirconium oxide, among others. If the wetting layer 150 is formed of a dielectric material, the wetting layer 150 may be formed to a sufficiently thin thickness that allows charges to tunnel therethrough.

Figure 9:
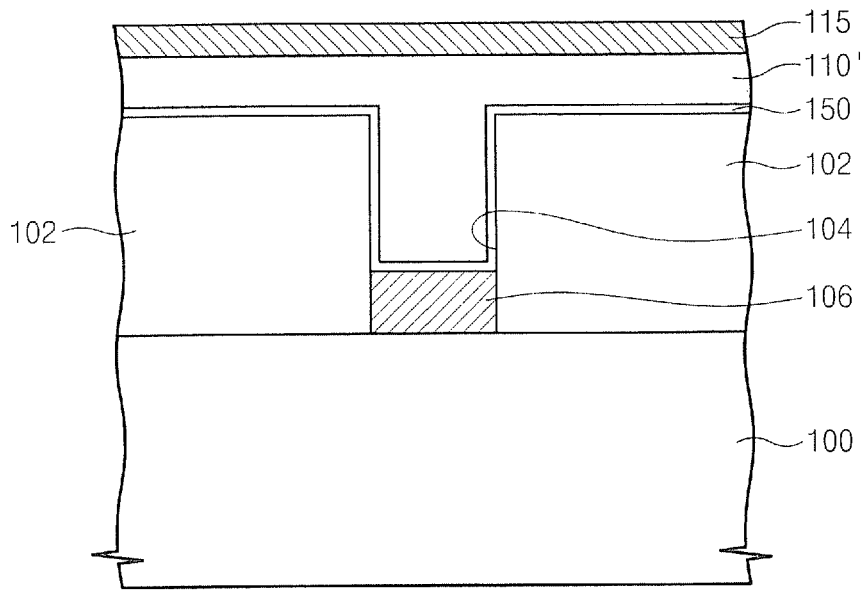

Referring to FIG. 9, a thermal treatment process may be performed on the phase change layer 110. The thermal treatment process may be the same as that discussed above regarding FIGS. 1-3. Accordingly, a portion of the phase change layer 110, which is located outside the opening 104, may migrate into the opening 104. Due to the specific elements in the phase change layer 110, a process temperature of the thermal treatment process may be lower than a melting point of the phase change layer 110. In addition, the migration characteristic of the phase change layer 110 may be further improved by the wetting layer 150.

A capping layer 115 may be formed on the substrate 100. As discussed above regarding FIGS. 1-3, the capping layer 115 may be formed on the deposited phase change layer 110 and/or the phase change layer 110' resulting from the thermal treatment process.

Figure 10:
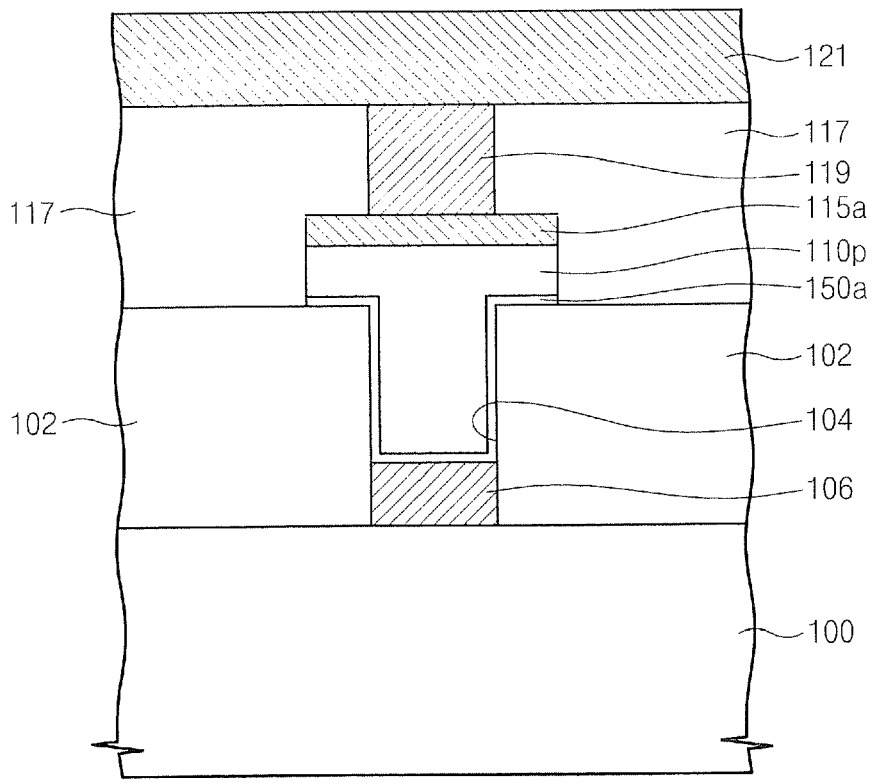

Referring to FIG. 10, the capping layer 115, the phase change layer 110', and the wetting layer 150 may be sequentially patterned to form a wetting pattern 150a, a phase change pattern 110p, and a capping electrode 115a that are sequentially stacked. In some embodiments, a second interlayer dielectric 117 is formed over the substrate 100. An interconnection plug 119 may be formed that penetrates the second interlayer dielectric 117 and connects to the capping electrode 115a. An interconnection 121 connecting with the interconnection plug 119 may be formed on the second interlayer dielectric 117.

Some embodiments provide that the capping layer 115, the phase change layer 110', and/or the wetting layer 150 may be planarized to expose a first interlayer dielectric 102. In such embodiments, a phase change pattern 110p and/or a wetting pattern 150a may be formed in the opening 104.

Some embodiments provide that the wetting layer 150 is also applicable to embodiments discussed above regarding FIGS. 5-7. That is, the wetting layer 150 may be formed on the substrate 100 having the opening 104 and a first phase change layer 108a may be formed on the wetting layer 150 by a CVD process. Thereafter, the subsequent processes may be performed in the same way as discussed above with reference to FIGS. 6 and 7.

The wetting pattern 150a may be disposed between the top of the heater electrode 106 and the bottom of the phase change pattern 110p in the opening 104. In some embodiments, the top of the heater electrode 106 may contact the bottom of the phase change pattern 110p in the opening 104, which will be described with reference to FIG. 11, which is a sectional view illustrating an exemplary modification of a wetting layer for methods of fabricating a semiconductor device according to some embodiments of the present invention.

Figure 11:
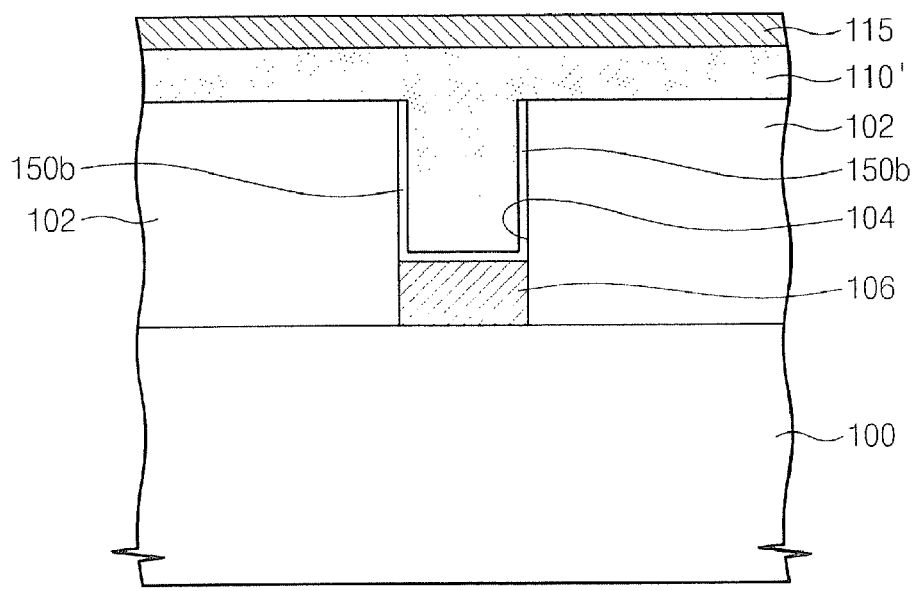
FIG. 11 is a sectional view illustrating an exemplary modification of a wetting layer for methods of fabricating a semiconductor device according to some embodiments of the present invention.

Referring to FIG. 11, before deposition of a phase change layer 110, a wetting layer 150 may be anisotropically etched to expose the top of the first interlayer dielectric 102 and the heater electrode 102. Accordingly, a wetting spacer 150b may be formed on the sidewall of the opening 104. Thereafter, a deposition process of the phase change layer 110, a thermal treatment process, and/or a formation process of a capping layer 115 may be performed as discussed above with reference to FIGS. 8 and 9. Consequently, a phase change layer 110' resulting from the thermal treatment process contacts the heater electrode 106, and the wetting spacer 150b may be disposed between the phase change layer 110' and the sidewall of the opening 104.

Figure 12:
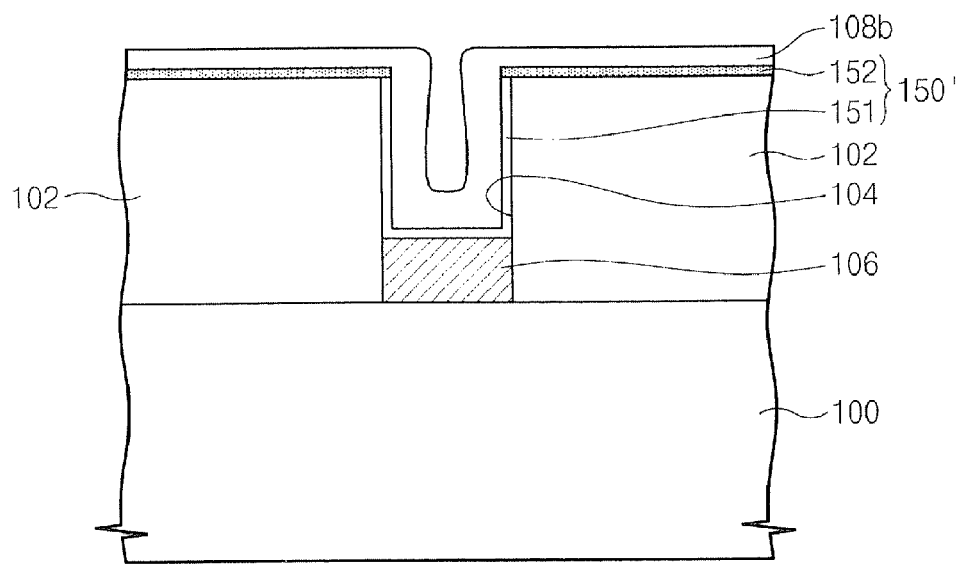
FIGS. 12 through 15 are sectional views illustrating methods of fabricating a semiconductor device according to some embodiments of the present invention.

FIGS. 12 through 15 are sectional views illustrating methods of fabricating a semiconductor device according to some other embodiments of the present invention. Referring to FIG. 12, a wetting layer may be formed on a substrate 100 having an opening 104. Some embodiments provide that the wetting layer may be formed of the same material as the wetting layer 150 as discussed above regarding FIGS. 8-10. The substrate 100 having the wetting layer may be treated with plasma. A wetting layer 150' resulting from the plasma treatment process may include a first part 151 disposed in the opening 104 and/or a second part 152 disposed on the top of a first interlayer dielectric 102. Herein, the second part 152 of the wetting layer 150' may be treated with the plasma and at least a portion of the first part 151 of the wetting layer 150' may be untreated with the plasma. Specifically, some embodiments provide that the first part 151 of the wetting layer 150' formed on the lower sidewall of the opening 104 may be untreated with the plasma. In some embodiments, the plasma treatment process may be a hydrogen plasma treatment process.

Some embodiments provide that the plasma treatment process may be performed anisotropically. In such embodiments, a portion of the first part 151 of the wetting layer 150' disposed on the top of the heater electrode 106 may be treated with the plasma. Even when the plasma treatment process is performed anisotropically, only the second part 152 of the wetting layer 150' may be treated with plasma by lowering a back-bias voltage.

In some embodiments, the plasma treatment process may be performed isotropically. In such embodiments, only the second part 152 outside the opening 104 may be treated with plasma by lowering the density of the plasma.

Some embodiments provide that a CVD process is performed to deposit a first phase change layer 108b on the substrate 100 having the wetting layer 150'. Herein, the deposition rate of the first phase change layer 108b on the plasma-untreated part of the wetting layer 150' may be higher than the deposition rate of the first phase change layer 108b on the plasma-treated part of the wetting layer 150'. That is, the plasma-treated part of the wetting layer 150' may suppress the growth of the first phase change layer 108b. Accordingly, the first phase change layer 108b may be deposited more rapidly in the outside of the opening 104 (i.e., on the second part 152) than in the inside of the opening 104 (i.e., on the first part 151 formed on the lower sidewall of the opening 104). Consequently, when the first phase change layer 108b is deposited, an overhang of the opening 104 may be minimized. Also, the deposition amount of the first phase change layer 108b in the opening 104 may increase. The first phase change layer 108b may be formed of the same material as the first phase change layer 108a as discussed above regarding FIGS. 5-7. That is, in some embodiments, the first phase change layer 108b contains at least one of selenium and/or tellurium, and one or more specific elements. The specific elements are the same as those discussed above regarding FIGS. 1-3.

Figure 13:
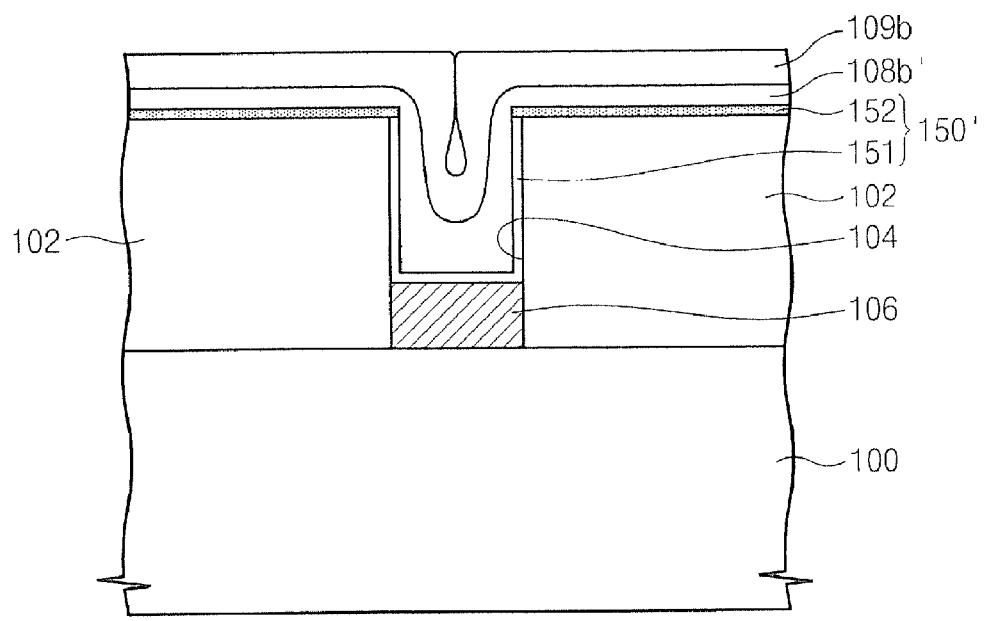

Referring to FIG. 13, a first thermal treatment process may be performed on the first phase change layer 108b. Accordingly, a portion of the first phase change layer 108b, which is located outside the opening 104, may migrate into the opening 104. A first phase change layer 108b' resulting from the first thermal treatment process may form a space, which is larger in an entry width than in a bottom width, in the opening 104. The first thermal treatment process and the deposition process of the first phase change layer 108b may be performed in situ and/or ex situ. The first thermal treatment process may be the same as the first thermal treatment process as discussed above regarding FIGS. 5-7. Thereafter, a second phase change layer 109b may be deposited by a PVD process. The second phase change layer 109b may be formed of the same material as the second phase change layer 109a as discussed above regarding FIGS. 5-7. That is, the second phase change layer 109b may be formed of a compound containing the specific elements and at least one of selenium and/or tellurium. The second phase change layer 109b may be formed of the same material as the first phase change layer 108b. In some embodiments, a void may be generated in the opening when forming the second phase change layer 109b.

Figure 14:
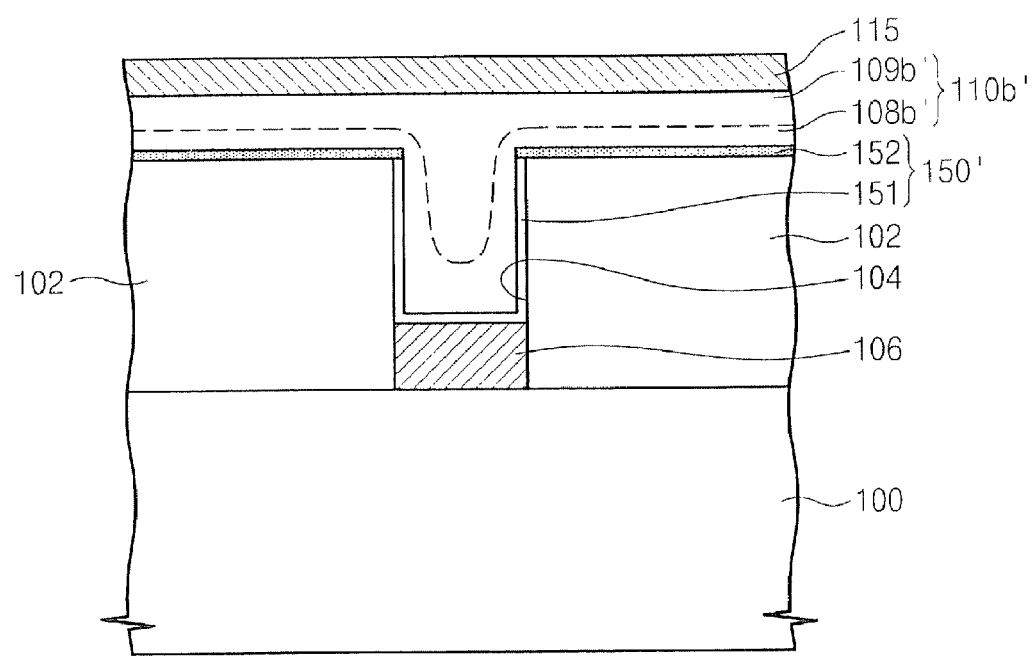

Referring to FIG. 14, a second thermal treatment process is performed on the second phase change layer 109b. Accordingly, the second phase change layer 109b located outside the opening 104 migrates into the opening 104. A second phase change layer 109b' resulting from the second fills a void in the opening 104. The second thermal treatment process may be the same as the second thermal treatment process as discussed above regarding FIGS. 5-7. The second thermal treatment process and the deposition process of the second phase change layer 109b may be performed in situ and/or ex situ. A phase change layer 110b including the first and second phase change layers 108b' and 109b' may fill the opening 104 without allowing a void and/or seam therein.

According to some embodiments of the present invention, the first thermal treatment process may be omitted. That is, the first phase change layer 108b and the second phase change layer 109b may be sequentially stacked and the second thermal treatment process may be performed.

According to some embodiments of the present invention, the second thermal treatment process and the deposition process of the second phase change layer 109b may be omitted. That is, the first phase change layer 108b may be deposited to a sufficient thickness and the first thermal treatment process may be performed. Thereafter, the first phase change layer 108b' resulting from the first thermal treatment process may fill the opening 104.

A capping layer 115 may be formed on the substrate 100. In some embodiments, the capping layer 115 may be formed outside the opening 104. That is, some embodiments provide that the capping layer 115 may not be formed in the opening 104. The capping layer 115 may be formed on the second phase change layer 109b' resulting from the second thermal treatment process. Some embodiments provide that the capping layer 115 may be formed on the second phase change layer 109b before the second thermal treatment process. In such embodiments, the capping layer 115 may be formed outside the opening 104.

If the second thermal treatment process and the deposition process of the second phase change layer 109b are omitted, the capping layer 115 may be formed on the first phase change layer 108b or the first phase change layer 108b' before/after the first thermal treatment process.

Figure 15:
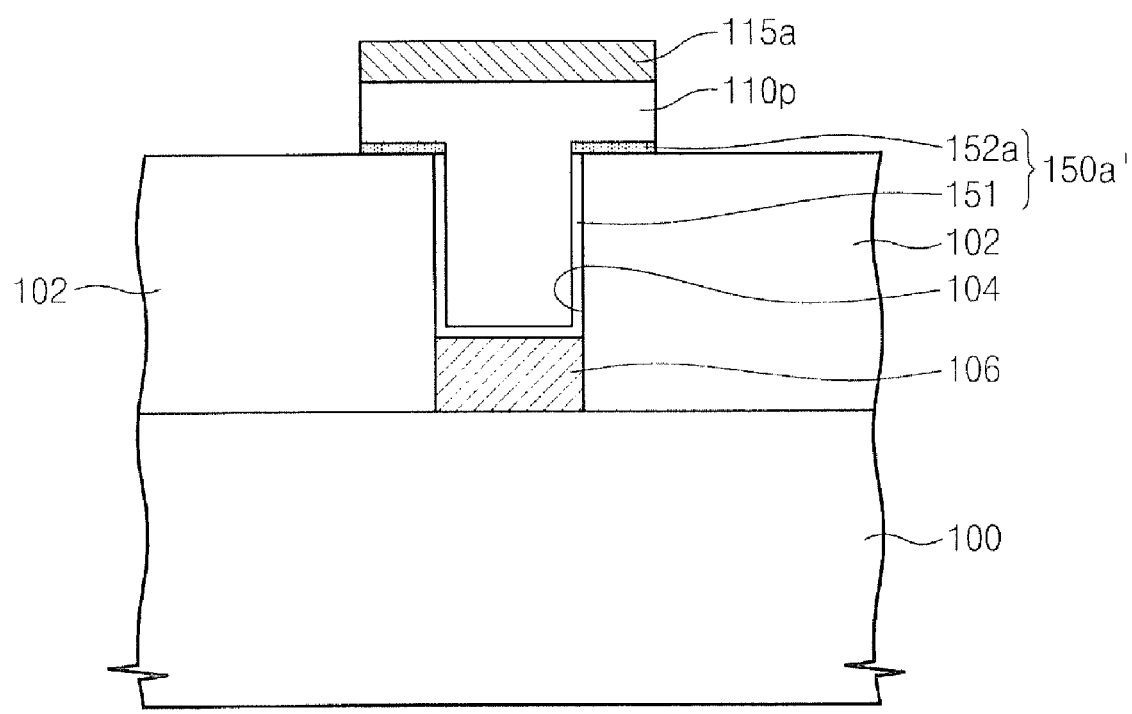

Referring to FIG. 15, the capping layer 115, the phase change layer 110b and the wetting layer 150' may be sequentially patterned to form a wetting pattern 150a', a phase change pattern 110p and a capping electrode 115a. In some embodiments, the wetting pattern 150a' may include the first portion 151 in the opening 104 and a second portion 152a between the phase change pattern 110p and a top surface of the first interlayer dielectric 102.

Some embodiments provide that the capping layer 115, the phase change layer 110b and/or the wetting layer 150' may be planarized to expose the first interlayer dielectric 102. In such embodiments, the phase change pattern 110p and/or the wetting pattern 150a' may be formed in the opening 104. Thereafter, the second interlayer dielectric 117, the interconnection plug 119 and the interconnection 121 of FIG. 10 may be formed.

According to semiconductor device fabrication methods described above, because the first phase change layer 108b contains the specific elements, the process temperature of the first thermal treatment process, which may migrate a portion of the first phase change layer 108b outside the opening 104 into the opening 104, may be lower than the melting point of the first phase change layer 108b. Also, the second part 152 of the wetting layer 150', which may be formed on the top of the first interlayer dielectric 102, may be treated with plasma to suppress the growth of the first phase change layer 108b. In some embodiments, at least a portion of the first part 151 of the wetting layer 150' in the opening 104 is untreated with the plasma, thereby facilitating the deposition of the first phase change layer 108b in the opening 104. Accordingly, an overhang of the opening 104 may be minimized. Consequently, by the first or second thermal treatment process with the process temperature lower than the melting point of the first phase change layer 108b, the phase change layer 110b including the first phase change layers 108b' may fill the opening 104 more easily.

The semiconductor device according to some embodiments of the present invention may include any semiconductor device that includes a variable resistor. For example, the semiconductor device according to some embodiments of the present invention may be a phase change memory device. That is, the phase change patterns may be included in a unit cell of a phase change memory device. A semiconductor device according to some embodiments of the present invention may be a logic device including a variable resistor, a memory device including a variable resistor, and/or a hybrid device including a variable resistor.

According to some embodiments of the present invention as described above, the phase change layer outside the opening may migrate into the opening by the thermal treatment process. Herein, the phase change layer may have the specific elements for lowering the process temperature of the thermal treatment process below the melting point of the phase change layer. Accordingly, by using the thermal treatment process with the process temperature lower than the melting point, the phase change layer may fill the opening without allowing a void and/or seam therein. Consequently, a program area (i.e., a phase change area) of the phase change layer may be formed within the opening, thereby making it possible to reduce the program current amount necessary for a program operation. Accordingly, it may be possible to implement a semiconductor device including a phase change layer of high integration and/or low power consumption. Further, the phase change layer may be migrated at the temperature lower than the melting point, to fill the opening, thereby making it possible to prevent the characteristic degradation of the phase change layer.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of fabricating a semiconductor device, comprising:
   forming a dielectric layer on a substrate;
   forming an opening in the dielectric layer;
   depositing, on the substrate having the opening, a phase change layer that contains an element that lowers a process temperature of a thermal treatment process to a temperature that is less than a melting point of the phase change layer; and
   migrating a portion of the phase change layer from outside the opening, into the opening by the thermal treatment process that includes the process temperature that is lower than the melting point of the phase change layer.

2. The method of claim 1, wherein the element has a lower melting point than the melting point of the phase change layer.

3. The method of claim 2, wherein the process temperature of the thermal treatment process is equal to or higher than the melting point of the specific element.

4. The method of claim 1, wherein the element is a metal.

5. The method of claim 1, wherein a composition ratio of the element in the phase change layer includes a range from about 1% to about 22%.

6. The method of claim 1, wherein a density of the element in a liquid-phase is higher than a density of the specific element in a solid-phase.

7. The method of claim 1, further comprising, before depositing the phase change layer, forming a wetting layer conformally on the substrate having the opening.

8. The method of claim 7, further comprising, before depositing the phase change layer, treating the wetting layer with plasma,
   wherein the wetting layer on top of the dielectric layer is treated with the plasma and the wetting layer on a lower sidewall of the opening is untreated with the plasma.

9. The method of claim 8, wherein the phase change layer is formed by a chemical vapor deposition (CVD) process, and a deposition rate of the phase change layer on the wetting layer untreated with the plasma is higher than a deposition rate of the phase change layer on the wetting layer treated with the plasma.

10. The method of claim 8, wherein the wetting layer is treated with hydrogen plasma.

11. The method of claim 7, further comprising, before depositing the phase change layer, etching the wetting layer anisotropically to form a wetting spacer on a sidewall of the opening.

12. The method of claim 7, wherein the wetting layer includes at least one of niobium oxide and zirconium oxide.

13. The method of claim 12, wherein the wetting layer has a thickness that is sufficiently thin to allow charges to tunnel therethrough.

14. The method of claim 7, wherein the wetting layer comprises a conductive material.

15. The method of claim 1, wherein depositing the phase change layer and migrating of the portion of the phase change layer from outside the opening, into the opening by the thermal treatment process are performed in situ in a process chamber.

16. The method of claim 1, wherein depositing the phase change layer comprises:
   depositing a first phase change layer on the substrate having the opening by a chemical vapor deposition (CVD) process; and
   depositing a second phase change layer on the first phase change layer by a physical vapor deposition (PVD) process.

17. The method of claim 16, wherein migrating the portion of the phase change layer from outside the opening, into the opening by the thermal treatment process comprises:
   migrating a portion of the first phase change layer from outside the opening, into the opening by a first thermal treatment process; and
   migrating a portion of the second phase change layer from outside the opening, into the opening by a second thermal treatment process.

18. The method of claim 17, wherein depositing the first phase change layer and migrating the portion of the first phase change layer from outside the opening, into the opening by the first thermal treatment process are performed in situ in a process chamber.

19. The method of claim 17, wherein depositing the second phase change layer and migrating the portion of the second phase change layer from outside the opening, into the opening by the second thermal treatment process are performed in situ in a process chamber.

20. The method of claim 16, wherein migrating the portion of the phase change layer from outside the opening, into the opening by the thermal treatment process comprises migrating a portion of the second phase change layer from outside the opening, into the opening by a first thermal treatment process.

* * * * *